(12) United States Patent
Dickinson

(10) Patent No.: US 6,852,644 B2
(45) Date of Patent: Feb. 8, 2005

(54) ATMOSPHERIC ROBOT HANDLING EQUIPMENT

(75) Inventor: John Dickinson, San Jose, CA (US)

(73) Assignee: The BOC Group, Inc., Murray Hill, NJ (US)

(*) Notice: Subject to any disclaimer, the term of this patent is extended or adjusted under 35 U.S.C. 154(b) by 19 days.

(21) Appl. No.: 10/303,372

(22) Filed: Nov. 25, 2002

(65) Prior Publication Data

US 2004/0102059 A1 May 27, 2004

(51) Int. Cl.$^7$ .................................................. H01L 21/31
(52) U.S. Cl. ........................................ 438/758; 414/217
(58) Field of Search ........................... 438/758; 414/217, 414/416

(56) References Cited

U.S. PATENT DOCUMENTS

| | | | |
|---|---|---|---|
| 5,217,053 A | 6/1993 | Foster et al. ................... 141/98 |
| 5,223,001 A | 6/1993 | Saeki ......................... 29/25.01 |
| 5,486,080 A | * 1/1996 | Sieradzki ..................... 414/217 |
| 5,752,769 A | 5/1998 | Weber et al. .................. 366/15 |
| 5,882,165 A | 3/1999 | Maydan et al. .............. 414/217 |
| 5,934,856 A | 8/1999 | Asakawa et al. ............. 414/217 |
| 6,075,334 A | 6/2000 | Sagues et al. .......... 318/568.11 |
| 6,167,322 A | 12/2000 | Holbrooks ................... 700/112 |
| 6,242,879 B1 | 6/2001 | Sagues et al. .............. 318/567 |
| 6,256,555 B1 | 7/2001 | Bacchi et al. ............... 700/245 |
| 6,257,827 B1 * | 7/2001 | Hendrickson et al. ...... 414/805 |
| 6,270,306 B1 * | 8/2001 | Otwell et al. .......... 414/222.13 |
| 6,287,386 B1 | 9/2001 | Perlov et al. ............... 118/719 |
| 6,292,708 B1 | 9/2001 | Allen et al. .................. 700/121 |
| 6,305,895 B1 | 10/2001 | Ozawa et al. ............... 414/217 |
| 6,315,512 B1 | 11/2001 | Tabrizi et al. .............. 414/217 |
| 6,318,944 B1 | 11/2001 | Shimeno et al. ............. 414/172 |
| 6,323,616 B1 | 11/2001 | Sagues et al. ......... 318/568.11 |
| 6,327,517 B1 | 12/2001 | Sundar ........................ 700/245 |
| 6,331,095 B1 | 12/2001 | Hiroki ................... 414/222.01 |
| 6,368,051 B2 | 4/2002 | Raaijmakers ................. 414/85 |
| 6,385,503 B2 | 5/2002 | Volle .......................... 700/218 |
| 6,395,094 B1 | 5/2002 | Tanaka et al. .............. 118/719 |
| 6,431,807 B1 * | 8/2002 | Stevens et al. ............. 414/217 |
| 6,722,835 B1 * | 4/2004 | Stevens et al. ............. 414/217 |
| 6,729,824 B2 * | 5/2004 | Lei et al. .................... 414/217 |

FOREIGN PATENT DOCUMENTS

| | | | | |
|---|---|---|---|---|
| EP | 0 848 412 A2 | 6/1998 | ........... | H01L/21/00 |
| EP | WO98/50946 | 11/1998 | ........... | H01L/21/00 |

* cited by examiner

Primary Examiner—John F. Niebling
Assistant Examiner—Olivia Luk
(74) Attorney, Agent, or Firm—David A. Hey

(57) ABSTRACT

A semiconductor-manufacturing tool has two load locks, one for semiconductor wafers entering the tool for processing and the other for wafers leaving the tool after being processed. The load locks are of a new generation capable of being evacuated or vented in shorter times than load locks of the prior art, and permit high throughput. The tool is associated with three atmospheric wafer-handling robots to obtain the high throughput permitted by the load locks. One robot transfers wafers to be processed from a supply to a wafer pre-aligner, another robot transfers wafers from the wafer pre-aligner to the load lock for wafers entering the tool, and the third transfers processed wafers from the load lock for wafers leaving the tool back to the supply.

14 Claims, 3 Drawing Sheets

ATMOSPHERIC ROBOT HANDLING EQUIPMENT

BACKGROUND OF THE INVENTION

1. Field of the Invention

The present invention generally relates to the handling and transfer of wafers typically used in the fabrication of integrated circuits and flat panel displays.

2. Description of the Prior Art

Vacuum processing systems for processing 100-mm, 200-mm, 300-mm or other diameter wafers are generally known. A typical vacuum processing system, which may also be referred to as a semiconductor manufacturing tool, has a centralized transfer chamber, or vacuum central handler, which is the center of activity for the movement of wafers being processed in the system. One or more process chambers attach to the transfer chamber at valves through which the wafers are passed by a robot in the transfer chamber. The valves are selectively opened and closed to isolate the process chambers from the transfer chamber while wafers are being processed in the process chambers. Physically, the process chambers are either supported by the transfer chamber and its platform or are supported on their own platform or platforms. Inside the system, the transfer chamber is typically held at a constant vacuum, while the process chambers may be pumped to a higher vacuum as may be required to perform the processes being carried out therein. Afterward, the chamber pressure level must be returned to that in the transfer chamber before the valve can be opened to permit access between the chambers, so that a wafer that has been processed can be removed and one to be processed can be placed therein.

Access to the transfer chamber from outside the semiconductor-manufacturing tool is typically gained through one or more load-lock chambers. The load-lock chambers cycle between the pressure level of the ambient atmosphere of the manufacturing facility, such as a clean room, and the vacuum pressure level in the transfer chamber in order for the wafers to be passed therebetween. As such, the load-lock chambers transition the wafers between the atmospheric pressure of a very clean environment to the vacuum of the transfer chamber. Load-lock chambers are designed to hold only a single wafer, or may have a sufficiently large volume to hold several wafers, for example, typically up to twenty-five wafers. In such a case, the wafers are stacked above one another in a wafer cassette with a horizontal space between each wafer to permit a robot wand to reach under a wafer to remove it for processing.

The load-lock chambers may open to the ambient environment for an operator to load a wafer cassette, or pod, thereinto or wafers may be transferred from a pod to a load lock chamber in a very clean environment at atmospheric pressure. In the latter instance, there may also be a wafer orienter or aligner at a point between the wafer pod and load lock chamber to align the wafer so that the wafer will be properly oriented in the load lock chamber.

Transfer chambers commonly have four to six facets, or sides, where process chambers and load-lock chambers can be mounted. A six-faceted, or six-sided, transfer chamber typically has load-lock chambers mounted on two facets and process chambers mounted on the other four facets. The process chambers may be, for example, rapid thermal processing (RTP) chambers, physical vapor deposition (PVD) chambers, chemical vapor deposition (CVD) chambers, etch chambers, and others. The productivity of a vacuum processing system is increased when more process chambers are mounted to the transfer chamber because more wafers can then be processed at a given time. Additionally, less space is required in the manufacturing facility to process a certain number of wafers if the productivity of the system is maximized.

Single-wafer load lock chambers present several advantages to one seeking ways to increase productivity in a wafer-processing facility. Typically, the volume of a single-wafer load-lock chamber, or load lock, is much smaller than that of one capable of holding a wafer pod. As a consequence, a single-wafer load lock can be evacuated, or pumped down, to a vacuum and vented, or restored to ambient atmospheric conditions, much more quickly than one capable of holding a wafer pod. In addition, a single-wafer load lock can be used to perform pre-heating, cool-down or other ancillary processes on the wafers to save room for other equipment in the process chambers.

SUMMARY OF THE INVENTION

The present invention relates to a semiconductor-manufacturing tool having single-wafer load locks of a new generation which can be evacuated and vented more quickly than those previously available. In order to derive more benefit from the time saved with the new load locks, the invention is directed toward improved handling of the wafers in the ambient environment at atmospheric pressure in the clean room manufacturing facility.

Accordingly, the present invention is a semiconductor-manufacturing system for processing semiconductor wafers. The system comprises a semiconductor-manufacturing tool and associated atmospheric robot handling equipment.

The semiconductor-manufacturing tool comprises a vacuum central handler, a first load lock, a second load lock, and a wafer-handling robot within the vacuum central handler. The vacuum central handler gives access to one or more process chambers for processing the semiconductor wafers.

The first and second load locks provide access between the vacuum central handler and outside the tool for the semiconductor wafers. The first load lock is usually dedicated for wafers entering the vacuum central handler from outside the tool (that is, for "incoming" wafers). The second load lock, on the other hand, is usually dedicated for wafers returning outside from the vacuum central handler after processing (that is, for "outgoing" wafers). Alternatively, each load lock may be configured to handle and accommodate both incoming and outgoing wafers. The load locks are preferably of a newer generation of load locks which can be evacuated or vented in between about one to four seconds, for example, in about two seconds.

The wafer-handling robot is within the vacuum central handler and removes wafers to be processed from the first load lock and places processed wafers into the second load lock. Alternatively, it may remove wafers to be processed from either the first or the second load lock and place processed wafers into either the first or the second load lock.

The atmospheric robot handling equipment comprises first, second and third atmospheric wafer-handling robots and a wafer pre-aligner. The first atmospheric wafer-handling robot transfers wafers to be processed one-by-one from a supply thereof to said wafer pre-aligner, which orients the wafers in a desired manner. The second atmospheric wafer-handling robot transfers wafers to be processed from the wafer pre-aligner to the first load lock. Finally, the third atmospheric wafer-handling robot transfers processed wafers one-by-one from the second load lock back to the supply. Alternatively, the second and third atmospheric wafer-handling robots may place wafers to be processed into and remove processed wafers from either the first or the second load locks.

The present invention will now be described in more complete detail with frequent reference being made to the drawings identified below.

DETAILED DESCRIPTION OF THE PREFERRED EMBODIMENT

Figure 1:
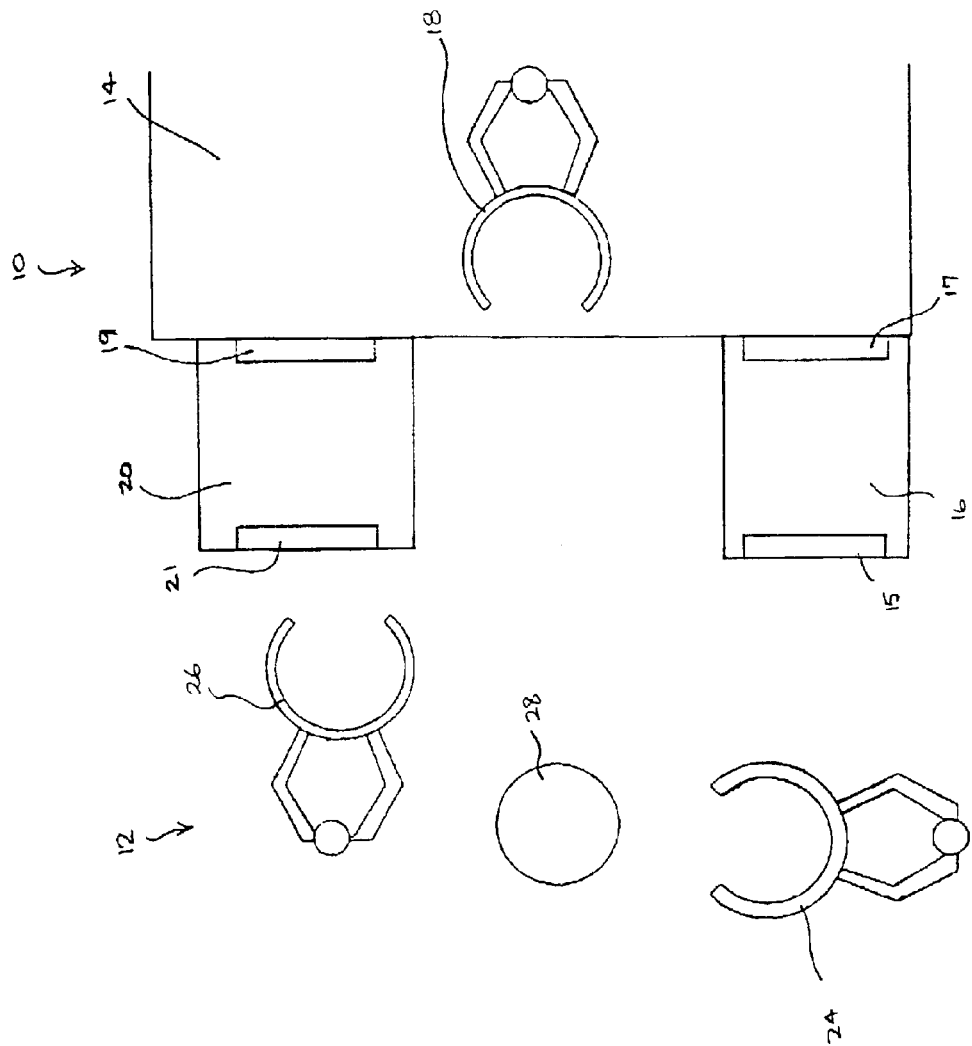
FIG. 1 is a schematic view of a prior-art semiconductor-manufacturing tool and its associated atmospheric robot handling equipment.

Turning now to these figures, FIG. 1 is a schematic view of a semiconductor-manufacturing tool 10 and its associated atmospheric robot handling equipment 12 of the prior art. Semiconductor-manufacturing tool 10 includes a vacuum central handler 14 which houses a wafer-handling robot 18 and affords access to one or more process chambers not shown in the figure. Wafer-handling robot 18 may be one of any suitable varieties, such as three-arm and frog-leg robots, among others.

Semiconductor-manufacturing tool 10 also includes a first load lock 16 and a second load lock 20. In semiconductor-manufacturing tool 10, the first load lock 16 is used to introduce semiconductor wafers into the vacuum central handler 14 for processing in one or more of the process chambers not shown in the figure. The second load lock 20 is used to remove semiconductor wafers from the vacuum central handler 14 after processing. Both the first and second load locks 16,20 cycle between the ambient atmosphere of the clean room or other facility where the tool 10 is disposed and the vacuum at which the vacuum central handler 14 is maintained. More specifically, when a wafer is being introduced into the vacuum central handler 14, it does so by way of the first load lock 16, which is initially open to the atmosphere of the clean room. Once a wafer is disposed in the first load lock 16, its access opening 15 to the ambient atmosphere is closed and the first load lock 16 is pumped down to a vacuum. When the first load lock 16 reaches a vacuum, an access opening 17 therefrom to the vacuum central handler 14 is opened so that the wafer may be transferred by the wafer-handling robot 18 to the process chamber. This latter access opening 17 is then closed; the first load lock 16 is vented to the ambient atmosphere; and, finally, the access opening 15 to the ambient atmosphere is opened so that another wafer may be introduced.

In a similar manner, when a processed wafer is to be removed from the vacuum central handler 14, it is done by way of second load lock 20, which is initially open to the vacuum of the vacuum central handler 14. When the wafer is removed by wafer-handling robot 18 from the process chamber (or a temporary location) after processing and disposed in the second load lock 20, its access opening 19 to the vacuum central handler 14 is closed, and the second load lock 20 is vented to the ambient atmosphere. Finally, an access opening 21 to the ambient atmosphere is opened so that the wafer may be removed. This latter access opening 21 is then closed; the second load lock 20 is then pumped down to a vacuum; and the access opening 19 to the vacuum central handler 14 is opened so that another wafer may be removed.

Turning now to the left-hand side of FIG. 1, wafers to be processed are obtained from, and processed wafers are returned to, a wafer pod 22. The wafer pod 22, for example, may have a vertical array of horizontal wafer supporting rails so that it may hold, for example, as many as twenty-five wafers. It should be understood by the reader that, once all of the wafers carried in the wafer pod 22 have been processed, it may be replaced at an appropriate moment with a fresh wafer pod 22 of wafers to be processed. Moreover, more than one wafer pod 22 may be present at any given time, so that one having wafers to be processed may be readily available and automatically moved into position when all of the wafers in another have been processed.

Atmospheric robot handling equipment 12 comprises a first atmospheric wafer-handling robot 24 and a second atmospheric wafer-handling robot 26. As was the case with wafer-handling robot 18 in vacuum central handler 14, robots 24,26 may be of any one of the varieties currently in use by those of ordinary skill in the art, such as three-arm or frog-leg robots.

Atmospheric robot handling-equipment 12 also includes a wafer pre-aligner 28, which may be of any one of several commercially available types, such as, for example, an optical aligner. The wafer pre-aligner 28 orients the wafer in some pre-selected manner.

In operation, the first atmospheric wafer-handling robot 24 takes wafers to be processed from the wafer pod 22 one-by-one, places them on the wafer pre-aligner 28 which orients them in a desired manner, and then takes them from the pre-aligner and places them in the first load lock 16. Second atmospheric wafer-handling robot 26 takes the processed wafers from second load lock 20, and returns them one-by-one to the wafer pod 22.

It will be appreciated that the time required for the first and second atmospheric wafer-handling robots 24,26 to make the transfers described above, as well as the times required for the wafer pre-aligner 28 to properly align each wafer; for the cyclic venting and evacuating of the first and second load locks 16,20; and for the transfers made by the wafer-handling robot 18 in the vacuum central handler 14, all combine to place a limit on the maximum number of wafers that may be processed in the semiconductor-manufacturing tool 10 per hour, also referred to as the throughput of the tool 10.

The semiconductor-manufacturing tool 10 of the prior art and its associated atmospheric robot handling equipment 12 shown schematically in FIG. 1 can process at most approximately 100 wafers per hour. The throughput of the tool 10 cannot be much higher than this value because it is limited by the amount of time needed to evacuate the first and second load locks 16,20, and to vent them to bring them from a vacuum back to ambient atmospheric pressure.

The first and second load locks 16,20 of the semiconductor-manufacturing tool 10 of the prior art typically have a pump-down, or evacuation, time of about thirty seconds, and a venting time of about eight seconds. As a consequence, wafers can pass through first and second load locks 16,20, entering or leaving vacuum central handler 14, no faster than once every forty seconds or so, and, in that case, the tool 10 can process only about ninety wafers per hour at most.

In view of the time requirements for evacuating and venting the first and second load locks 16,20, the first and second atmospheric wafer-handling robots 24,26, the wafer pre-aligner 28, and the wafer-handling robot 18 within the vacuum central handler 14 do not limit the throughput of the tool 10 because they perform their specific tasks in time intervals significantly less than those required for evacuating and venting the first and second load locks 16,20. In this respect, the first and second load locks 16,20 are a bottleneck to increasing the throughput of the tool 10 of the prior art.

Figure 2:
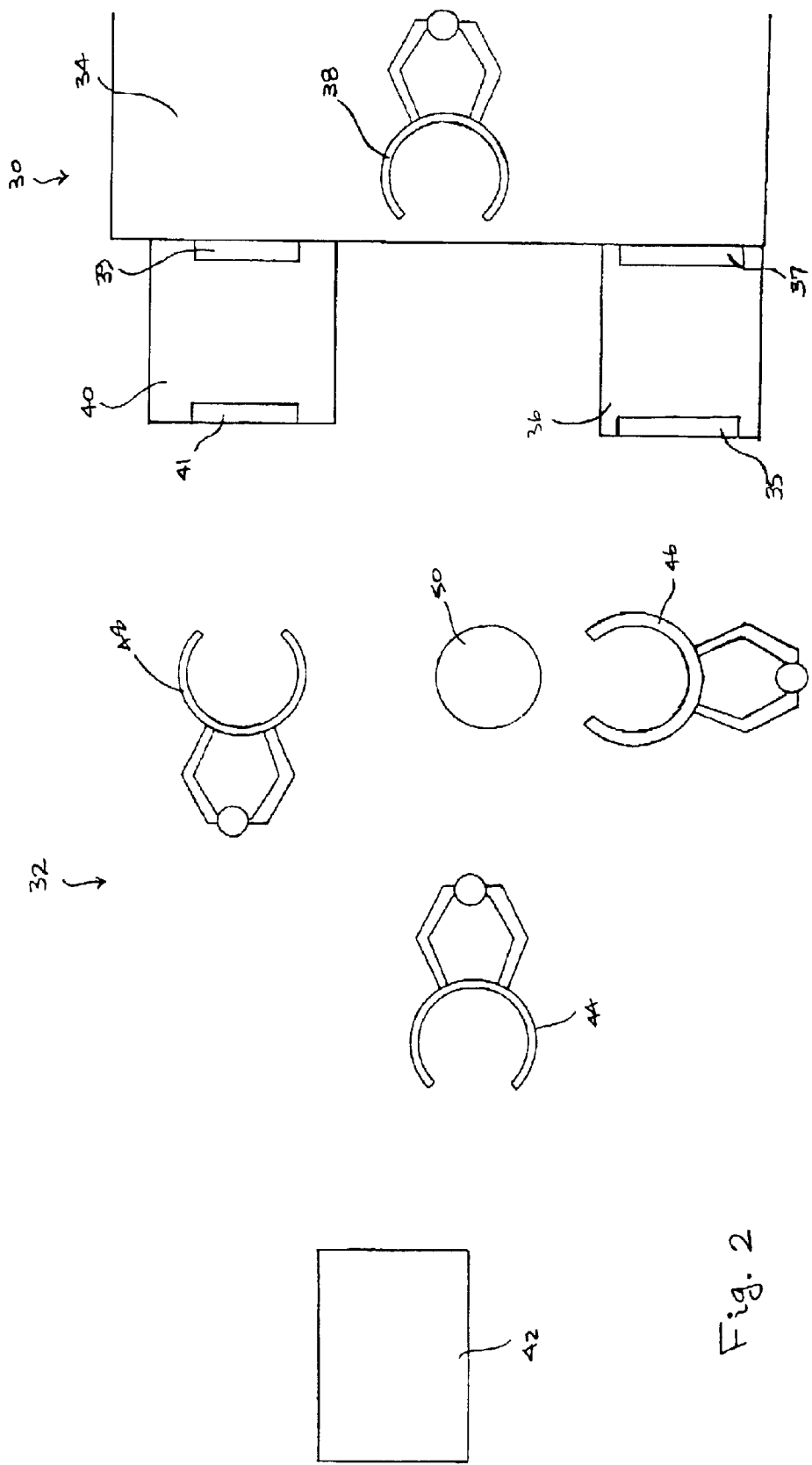
FIG. 2 is a schematic view of the semiconductor-manufacturing tool and its associated atmospheric robot handling equipment of the present invention.

FIG. 2 is a schematic view of a semiconductor-manufacturing tool 30 and its associated atmospheric robot handling equipment 32 of the present invention. Like the prior-art tool 10 described above, semiconductor-manufacturing tool 30 includes a vacuum central handler 34 affording access to one or more process chambers not shown in the figure.

Semiconductor-manufacturing tool 30 includes a first load lock 36 and a second load lock 40. As in semiconductor-manufacturing tool 10, the first load lock 36 is used to introduce semiconductor wafers into the vacuum central handler 34 for processing in one or more of the process chambers not shown in the figure. First load lock 36 has access openings 35,37 analogous to access openings 15,17, respectively, of first load lock 16 in FIG. 1. The second load lock 40 is used to remove semiconductor wafers from the vacuum central handler 34 after processing. Second load lock 40 has access openings 39,41 analogous to access openings 19, 21, respectively, of second load lock 20 in FIG. 1. Both the first and second load locks 36,40 cycle between the ambient atmosphere of the clean room or other facility where the tool 30 is disposed and the vacuum at which the vacuum central handler 34 is maintained in the same manner as first and second load locks 16,20 described above. However, first and second load locks 36,40 are of a newer generation of load locks than first and second load locks 16,20, and can be pumped down to a vacuum in between about one to four seconds, for example, in about two seconds, and vented to the ambient atmosphere in about the same time interval, in contrast to the thirty seconds and eight seconds, respectively, required for the same operations by first and second load locks 16,20. The inclusion of first and second load locks 36,40 of the newer generation permits the throughput of semiconductor-manufacturing tool 30 to be much higher than that of tool 10, as will be shown in more complete detail below.

Within the vacuum central handler 34 is a wafer-handling robot 38, which performs the same functions as wafer-handling robot 18 of tool 10. Wafer-handling robot 38 is shown schematically in FIG. 2 and may be of any variety, such as three-arm and frog-leg robots, among others. Wafer-handling robot 38 removes incoming wafers one at a time from first load lock 36 and transfers them to a process chamber or to a temporary position in the semiconductor manufacturing tool 30. Wafer-handling robot 38 also transfers outgoing wafers from a process chamber or temporary position in the semiconductor manufacturing tool 30 to the second load lock 40.

Turning now to the left-hand side of FIG. 2, wafers to be processed are obtained from, and processed wafers are returned to, a wafer pod 42, for which the description given above for wafer pod 22 is equally applicable. Specifically, it should be understood that, once all of the wafers carried in the wafer pod 42 have been processed, it may be replaced at an appropriate moment with a fresh wafer pod 42 of wafers to be processed. Moreover, more than one wafer pod 42 may be present at any given time, so that one having wafers to be processed may be readily available and automatically moved into position when all of the wafers in another have been processed.

Atmospheric robot handling equipment 32 comprises three atmospheric wafer-handling robots instead of the two atmospheric wafer-handling robots 24,26 of the prior-art tool 10.

First wafer-handling robot 44 takes wafers to be processed from the wafer pod 42 one-by-one, and places them on a wafer pre-aligner 50, which orients them in a desired manner. The wafer pre-aligner 50 may be of any one of several commercially available types, such as, for example, an optical aligner, or any other suitable aligner. Second wafer-handling robot 46 takes the aligned wafers from the pre-aligner 50 and places them in the first load lock 36. It should be noted that the first and second wafer-handling robots 44,46 operate simultaneously (or in parallel) to transfer wafers from the wafer pod 42 to the wafer pre-aligner 50, and from the wafer pre-aligner to the first load lock 36, respectively.

Third atmospheric wafer-handling robot 48 takes the processed wafers from second load lock 40, and returns them one-by-one to the wafer pod 42. As above, first, second and third atmospheric wafer-handling robots 44,46,48 may be of any one of the varieties currently in use by those of ordinary skill in the art, such as three-arm or frog-leg robots.

Unlike the first and second load locks 16,20 of the prior-art semiconductor-manufacturing tool 10, the new generation first and second load locks 36,40, with their shorter evacuation and venting times, do not present a bottleneck for wafer throughput. Instead, the use of a single wafer-handling robot for transferring an incoming wafer from the wafer pod 42 to the wafer pre-aligner 50 and then to the first load lock 36 would become the rate-limiting step. The present invention circumvents this by providing first and second wafer-handling robots 44,46 to perform the sequential wafer transfer. That is, when a wafer is being transferred by wafer-handling robot 46 from the wafer pre-aligner 50 to the first load lock 36, another wafer from the wafer pod 42 can be transferred by wafer-handling robot 44 to the wafer pre-aligner 50. In this case, a wafer may be introduced into first load lock 36 and another may be removed from second load lock 40 as often as once every sixteen seconds. As a consequence, the semiconductor-manufacturing tool 30 may process as many as about 225 wafers per hour, representing a considerable improvement over the prior art throughput of about 100 wafers per hour.

Table I below is provided as an example to demonstrate the feasibility of achieving such a high throughput. It should be kept in mind, however, that a throughput of 225 wafers per hour is based on the assumption that each wafer has been removed from the first load lock 36 and placed into the second load lock 40 ten seconds later, a minimum time that does not include that required for any specific process. In reality, processing may involve a much longer time, possibly in stages, within the tool 30. As a consequence, the actual throughput will vary according to specific processing requirements.

In Table I, the numerical entries are the amounts of time, in seconds, which have elapsed since the system comprising semiconductor-manufacturing tool 30 and its associated atmospheric robot handling equipment 32 was activated to initiate the wafer-processing steps. The wafer pre-aligner 50 takes about six seconds to properly orient each wafer.

TABLE I

Example of Elapsed Times (in seconds) in a Wafer-Handling Cycle

|  | Wafer 1 | Wafer 2 | Wafer 3 |
|---|---|---|---|
| Robot 44 takes wafer from pod 42 | 6 | 22 | 38 |
| Robot 44 places wafer on pre-aligner 50 | 12 | 28 | 44 |
| Robot 46 takes wafer from pre-aligner 50 | 24 | 40 | 56 |
| Robot 46 places wafer in first load lock 36 | 30 | 46 | 62 |
| Robot 38 has removed wafer from first load lock 36 for transfer to process chamber | 44 | 60 | 76 |
| Robot 38 places processed wafer into second load lock 40 | 54 | 70 | 86 |
| Robot 48 takes wafer from second load lock 40 | 58 | 74 | 90 |
| Robot 48 places wafer in pod 42 | 68 | 84 | 100 |

It should be noted, with reference to this table, that once the first wafer is returned to wafer pod 42 after the initial 68 seconds, subsequent wafers are returned to pod 42 at 16-second intervals.

Further, after first atmospheric wafer-handling robot 44 places a wafer on the wafer pre-aligner 50 at 12 seconds on the clock, it is free to pick up another wafer from wafer pod 42, which it does 12 seconds later. In the prior-art system shown in FIG. 1, first atmospheric wafer-handling robot 24 performs the functions of both the first and second atmospheric wafer-handling robots 44,46. As such, it may not be free to pick up another wafer from wafer pod 42 until 30 seconds on the clock, when it has placed the first wafer into the first load lock 36. An improved throughput is clearly the result of substituting first and second atmospheric wafer-handling robots 44,46 for the single atmospheric wafer-handling robot 24 in the prior-art device shown in FIG. 1.

As discussed above, the first and second load locks 36,40 cycle between the vacuum conditions in the vacuum central handler 34 and the ambient atmosphere of the manufacturing facility. Table II below is provided to show how the load-lock cycles relate to the data presented in Table I, some of which is repeated in Table II for the sake of clarity.

TABLE II

Example of Elapsed Times (in seconds) in a Wafer-Handling Cycle

|  | Wafer 1 | Wafer 2 | Wafer 3 |
|---|---|---|---|
| Robot 46 places wafer in first load lock 36 | 30 | 46 | 62 |
| Start pump-down of first load lock 36 | 36 | 52 | 68 |
| Finish pump-down of first load lock 36 | 38 | 54 | 70 |
| Robot 38 has removed wafer from first load lock 36 for transfer to process chamber | 44 | 60 | 76 |
| Start venting of first load lock 36 | 44 | 60 | 76 |
| Finish venting of first load lock 36 | 46 | 62 | 78 |
| Start pump-down of second load lock 40 | * | 64 | 80 |
| Finish pump-down of second load lock 40 | * | 66 | 82 |
| Robot 38 places processed wafer into second load lock 40 | 54 | 70 | 86 |
| Start venting of second load lock 40 | 55 | 71 | 87 |
| Finish venting of second load lock 40 | 57 | 73 | 89 |
| Robot 48 takes wafer from second load lock 40 | 58 | 74 | 90 |

* second load lock 40 starts at vacuum

In Table II, the short two-second interval required for evacuating and venting the first and second load locks 36,40 is apparent.

The present invention may be used with any semiconductor-manufacturing tool having two load locks and atmospheric wafer-handling robots. Semiconductor-manufacturing tools of this type are available from Applied Materials, Inc. of Santa Clara, Calif. under the trade names Centura and Endura. CENTURA® and ENDURA® are registered trademarks owned by Applied Materials, Inc. Preferably, one load lock is dedicated to wafers entering the tool and the other is dedicated to wafers leaving the tool, as described above, although the tool may alternatively be configured in a manner that leaves both load locks available for incoming and outgoing wafers. In this alternative configuration, atmospheric wafer-handling robot 44 would continue to transfer wafers to be processed from the wafer pod 42 to the wafer pre-aligner 50, while atmospheric wafer-handling robots 46,48 would transfer wafers to be processed from the wafer pre-aligner 50 to first and second load locks 36,40, and would transfer processed wafers from first and second load locks 36,40 back to wafer pod 42, the first and second load locks 36,40 being used for incoming and outgoing wafers in a desired sequence. Although not shown in FIG. 2, the tool may alternatively have only a single load lock, instead of first and second load locks 36,40. In such an embodiment, atmospheric wafer-handling robot 44 would again continue to transfer wafers to be processed from the wafer pod 42 to the wafer pre-aligner 50, while atmospheric wafer-handling robots 46,48 would transfer wafers to be processed from the wafer pre-aligner 50 to the single load lock, and would transfer processed wafers from the single load lock back to wafer pod 42, in a desired sequence.

Semiconductor-manufacturing tools of this type may include one or more process chambers of the kinds noted above, and may be set up for either sequential or parallel processing. In the former, wafers proceed within the tool from one process chamber to the next and undergo different processes in a desired sequence. In the latter, two or more process chambers are set up to perform the same or different processes on the wafers, which are directed individually to any one of the process chambers devoted to the desired process.

Modifications to the above would be obvious to those of ordinary skill in the art without bringing the invention so modified beyond the scope of the appended claims. For example, FIG. 3 is a schematic view of an alternate embodiment of the semiconductor-manufacturing tool 60 and its associated atmospheric robot handling equipment 62 of the present invention.

Figure 3:
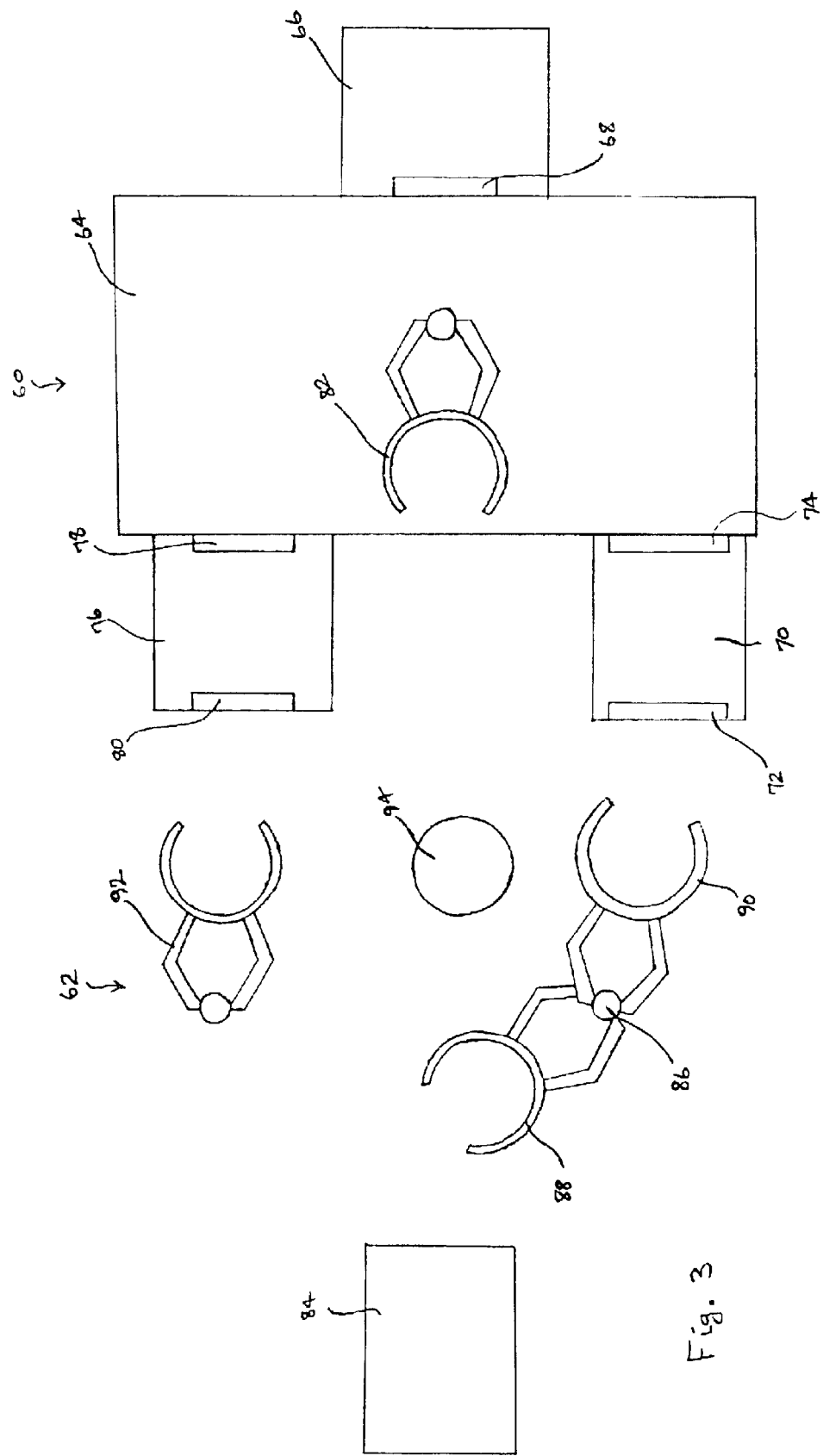
FIG. 3 is a schematic view of an alternate embodiment of the semiconductor-manufacturing tool and its associated atmospheric robot handling equipment of the present invention.

As shown in FIG. 3, semiconductor-manufacturing tool 60 includes a vacuum central handler 64 affording access to a process chamber 66 through an access opening 68. Process chamber 66 is preferably one in which wafers may be subjected to a process or processes having relatively short processing times to take advantage of the high throughput made possible by the present atmospheric robot handling equipment. In general, the process chamber 66 may be configured for a variety of processes, including, for example, deposition or etch. Access opening 68 isolates process chamber 66 from vacuum central handler 64 to enable process chamber 66 to be pumped down to a higher vacuum than that in the vacuum central handler 64.

Like semiconductor-manufacturing tool 30 of FIG. 2, semiconductor-manufacturing tool 60 includes a first load lock 70 and a second load lock 76. The first load lock 70 is used to introduce semiconductor wafers into the vacuum central handler 64, and has access openings 72,74 analogous to access openings 35,37, respectively, of first load lock 36 in FIG. 2. The second load lock 76 is used to remove semiconductor wafers from the vacuum central handler 64 after processing. Second load lock 76 has access openings 78,80 analogous to access openings 39,41, respectively, of second load lock 40 in FIG. 2. Both the first and second load locks 70,76 cycle between the ambient atmosphere of the clean room or other facility where the tool 60 is disposed and the vacuum at which the vacuum central handler 64 is maintained in the same manner as first and second load locks 16,20,36,40 described above. First and second load locks 70,76 are of the newer generation of load locks that can be pumped down to a vacuum in between about one to four seconds, for example, in about two seconds, and vented to the ambient atmosphere in about the same time interval.

Within the vacuum central handler 64 is a wafer-handling robot 82, which is shown schematically in FIG. 3 and may be of any variety, such as three-arm and frog-leg robots, among others. Wafer-handling robot 82 removes incoming wafers one at a time from first load lock 70 and transfers them to process chamber 66. Wafer-handling robot 82 also transfers outgoing wafers from process chamber 66 to the second load lock 76.

Turning now to the left-hand side of FIG. 3, wafers to be processed are obtained from, and processed wafers are returned to, a wafer pod 84, for which the descriptions given above for wafer pods 22,42 are equally applicable. It should again be understood that, once all of the wafers carried in the wafer pod 84 have been processed, it may be replaced at an appropriate moment with a fresh wafer pod 84 of wafers to be processed. Moreover, more than one wafer pod 84 may be present at any given time, so that one having wafers to be processed may be readily available and automatically moved into position when all of the wafers in another have been processed.

Atmospheric robot handling equipment 62 comprises three atmospheric wafer-handling robots in the form of one double atmospheric wafer-handling robot 86, for example, a dual-arm robot, having a first atmospheric wafer-handling robot 88 and second atmospheric wafer-handling robot 90 sharing a common axis, and a third atmospheric wafer-handling robot 92.

First atmospheric wafer-handling robot 88 takes wafers to be processed from the wafer pod 84 one-by-one, and places them on a wafer pre-aligner 94, which orients them in a desired manner. The wafer pre-aligner 50 again may be of any one of several commercially available types, such as, for example, an optical aligner, or any other suitable aligner. Second atmospheric wafer-handling robot 90 takes the aligned wafers from the pre-aligner 94 and places them in the first load lock 70. It should be noted that the first and second wafer-handling robots 88,90 operate simultaneously to transfer wafers from the wafer pod 84 to the wafer pre-aligner 94, and from the wafer pre-aligner 94 to the first load lock 70, respectively.

Third atmospheric wafer-handling robot 92 takes the processed wafers from second load lock 76, and returns them one-by-one to the wafer pod 84. The first and second atmospheric wafer-handling robots 88,90 and the third atmospheric wafer-handing robot 92 may be of any one of the varieties currently in use by those of ordinary skill in the art, such as three-arm or frog-leg robots.

In this alternate embodiment of the present invention, the first and second atmospheric wafer-handling robots 88,90 perform the sequential transfer performed by first and second atmospheric wafer-handling robots 44,46 in the embodiment shown in FIG. 2. That is, when a wafer is being transferred by wafer-handling robot 90 from the wafer pre-aligner 94 to the first load lock 70, another wafer from the wafer pod 84 can be transferred by wafer-handling robot 88 to the wafer pre-aligner 94, so that a wafer may be introduced into first load lock 70 and another may be removed from second load lock 76 as often as once every sixteen seconds. As a consequence, the semiconductor-manufacturing tool 60 may also process as many as about 225 wafers per hour, representing a considerable improvement over the prior art throughput of about 100 wafers per hour. Again, it should be born in mind that a throughput of 225 wafers per hour is based on the assumption that each wafer has been removed from the first load lock 70 and placed into the second load lock 76 ten seconds later, a minimum time that does not include that required for any specific process.

As was the case with the embodiment shown in FIG. 2, one load lock 70 is dedicated to wafers entering the tool 60 and the other load lock 76 is dedicated to wafers leaving the tool 60, as described above, although the tool 60 may alternatively be configured in a manner that leaves both load locks 70,76 available for incoming and outgoing wafers. In this alternative configuration, atmospheric wafer-handling robot 88 would continue to transfer wafers to be processed from the wafer pod 84 to the wafer pre-aligner 94, while atmospheric wafer-handling robot 90 and atmospheric wafer-handling robot 92 would transfer wafers to be processed from the wafer pre-aligner 50 to first and second load locks 70,76, and would transfer processed wafers from first and second load locks 70,76 back to wafer pod 84, the first and second load locks 70,76 being used for incoming and outgoing wafers in a desired sequence. Although not shown in FIG. 3, the tool may alternatively have only a single load lock, instead of first and second load locks 70,76. In such an embodiment, atmospheric wafer-handling robot 88 would again continue to transfer wafers to be processed from the wafer pod 84 to the wafer pre-aligner 94, while atmospheric wafer-handling robots 90,92 would transfer wafers to be processed from the wafer pre-aligner 94 to the single load lock, and would transfer processed wafers from the single load lock back to wafer pod 84, in a desired sequence.

It is understood that the atmospheric robot handling equipment of the present invention can generally be used in conjunction with semiconductor-manufacturing tools having different configurations. Depending on the specific process applications, such tools may, for example, have one or more single-wafer or batch-process chambers, or a single load lock, or may be configured to transfer processed wafers onto another tool or location for further processing (instead of back to the original wafer supply pod).

What is claimed is:

1. A semiconductor-manufacturing system for processing semiconductor wafers, said system comprising a semiconductor-manufacturing tool and associated atmospheric robot handling equipment, wherein:

said semiconductor-manufacturing tool has a vacuum central handler, a first load lock, a second load lock, and a wafer-handling robot; said vacuum central handler giving access to one or more process chambers for processing said semiconductor wafers; said first and second load locks providing access between said vacuum central handler and outside said semiconductor-manufacturing tool for said semiconductor wafers; said wafer-handling robot being within said vacuum central handler and removing wafers to be processed from either of said first and second load locks and placing processed wafers into either of said first and second load locks; and said associated atmospheric robot handling equipment has a first, a second and a third atmospheric wafer-handling robot and a wafer pre-aligner; said first atmospheric wafer-handling robot transferring wafers to be processed one-by-one from a supply thereof to said wafer pre-aligner; said wafer pre-aligner providing said wafers with a desired orientation; said second atmospheric wafer-handling robot transferring wafers to be processed from said wafer pre-aligner to said first load lock; and said third atmospheric wafer-handling robot transferring processed wafers from said second load lock back to said supply.

2. A system as claimed in claim 1, wherein said first load lock is dedicated for wafers entering said vacuum central handler from outside said tool, and said second load lock is dedicated for wafers returning outside from said vacuum central handler after processing, and wherein said wafer-handling robot within said vacuum central handler removes wafers to be processed from said first load lock and places processed wafers into said second load lock.

3. A system as claimed in claim 1, wherein said first and second load locks accommodate wafers entering and leaving said vacuum central handler in a desired sequence; wherein said second atmospheric wafer-handling robot transfers processed wafers from said first load lock back to said supply; and wherein said third atmospheric wafer-handling robot transfers wafers to be processed from said wafer-pre-aligner to said second load lock.

4. A system as claimed in claim 1, wherein said first and second atmospheric wafer-handling robots share a common axis as a double atmospheric wafer-handling robot.

5. A system as claimed in claim 1, wherein at least one of said first and second load locks may be evacuated in between about one to about four seconds.

6. A system as claimed in claim 1, wherein at least one of said first and second load locks may be vented in between about one to about four seconds.

7. A system as claimed in claim 1, wherein said semiconductor-manufacturing tool is set up for sequential processing.

8. A system as claimed in claim 1, wherein said semiconductor-manufacturing tool is set up for parallel processing.

9. A semiconductor-manufacturing system for processing semiconductor wafers, said system comprising a semiconductor-manufacturing tool and associated atmospheric robot handling equipment, wherein:

said semiconductor-manufacturing tool has a vacuum central handler, a load lock, and a wafer-handling robot; said vacuum central handler giving access to one or more process chambers for processing said semiconductor wafers; said load lock providing access between said vacuum central handler and outside said semiconductor-manufacturing tool for said semiconductor wafers; said wafer-handling robot being within said vacuum central handler and removing wafers to be processed from said load lock and placing processed wafers into said load lock; and said associated atmospheric robot handling equipment has a first, a second and a third atmospheric wafer-handling robot and a wafer pre-aligner; said first atmospheric wafer-handling robot transferring wafers to be processed one-by-one from a supply thereof to said wafer pre-aligner; said wafer pre-aligner providing said wafers with a desired orientation; said second atmospheric wafer-handling robot transferring wafers to be processed from said wafer pre-aligner to said load lock; and said third atmospheric wafer-handling robot transferring processed wafers from said load lock back to said supply.

10. A system as claimed in claim 9, wherein said first and second atmospheric wafer-handling robots share a common axis as a double atmospheric wafer-handling robot.

11. A system as claimed in claim 9, wherein said load lock may be evacuated in between about one to about four seconds.

12. A system as claimed in claim 9, wherein said load lock may be vented in between about one to about four seconds.

13. A system as claimed in claim 9, wherein said semiconductor-manufacturing tool is set up for sequential processing.

14. A system as claimed in claim 9, wherein said semiconductor-manufacturing tool is set up for parallel processing.

* * * * *